(12) United States Patent
Park et al.

(10) Patent No.: US 7,077,912 B2
(45) Date of Patent: ***Jul. 18, 2006

(54) SEMICONDUCTOR MANUFACTURING SYSTEM

(75) Inventors: Seung-kap Park, Suwon (KR); Jeong-ho Yoo, Suwon (KR)

(73) Assignee: Terasemicon Corporation, Hwaseong (KR)

( * ) Notice: Subject to any disclaimer, the term of this patent is extended or adjusted under 35 U.S.C. 154(b) by 319 days.

This patent is subject to a terminal disclaimer.

(21) Appl. No.: 10/322,486

(22) Filed: Dec. 19, 2002

(65) Prior Publication Data

US 2004/0099219 A1    May 27, 2004

(30) Foreign Application Priority Data

Nov. 26, 2002   (KR) .................... 10-2002-0073699

(51) Int. Cl.
*H01L 21/00*  (2006.01)
*C23C 16/00*  (2006.01)

(52) U.S. Cl. ..................... 118/725; 118/715; 118/724; 156/345.51; 156/345.52; 206/832; 219/444.1; 392/418

(58) Field of Classification Search ............... 118/725, 118/715–733; 156/345.52, 345.51; 206/832; 414/416.01; 219/444.1; 392/418
See application file for complete search history.

(56) References Cited

U.S. PATENT DOCUMENTS

| 5,482,559 A | 1/1996 | Imai et al. |
| 5,915,957 A | 6/1999 | Tanigawa |
| 6,321,680 B1 * | 11/2001 | Cook et al. ............... 118/723 E |

2002/0038164 A1   3/2002   Osaka et al.

FOREIGN PATENT DOCUMENTS

| DE | 43 42 976 | 6/1994 |
| EP | 0 818 807 | 1/1998 |
| EP | 1 253 631 | 10/2002 |
| JP | 04120723 | 4/1992 |

* cited by examiner

*Primary Examiner*—Ram N Kackar
(74) *Attorney, Agent, or Firm*—Rothwell Figg Ernst & Manbeck

(57) ABSTRACT

Provided is a semiconductor manufacturing system capable of loading a plurality of semiconductor wafers into a vertical reaction tube, and performing a thermal process. The semiconductor manufacturing system includes a first wafer loading boat, a second wafer loading boat, a plate cap, a door plate and a lifting system. The first wafer loading boat is mounted in the reaction tube and includes a plurality of holder supporters that support a wafer holder in a shape of a board, the wafer holder being loaded vertically at a predetermined interval and on which the semiconductor wafer is rested on. The second wafer loading boat is inside or outside the first wafer loading boat and has a wafer supporter that supports the semiconductor wafer. The lifting system moves either the first wafer loading boat or the second wafer loading boat vertically and separates the semiconductor wafer, which is loaded on the wafer holder, from the wafer holder at a predetermined height. The semiconductor manufacturing system makes it possible to easily load or unload the semiconductor wafer in the wafer loading boats without an additional wafer handling structure. The system also enables to control the gap between the semiconductor wafer and the wafer holder statically from the beginning of thermal processing and dynamically during the thermal processing in order to eliminate any mechanical damages to the wafer caused by stress.

22 Claims, 11 Drawing Sheets

SEMICONDUCTOR MANUFACTURING SYSTEM

BACKGROUND OF THE INVENTION

1. Field of the Invention

The present invention relates to a semiconductor manufacturing system, and more particularly, to a semiconductor manufacturing system having a vertical reaction tube by which a plurality of semiconductor wafers can be processed at a time.

2. Description of the Related Art

Since a thermal process during semiconductor manufacturing needs considerable time, it is preferable that a plurality of semiconductor wafers be processed at one time. Generally, a wafer loading boat as a wafer loading structure on which a semiconductor wafer can be deposited horizontally and a vertical reaction tube in a pipe shape are used in the semiconductor manufacturing system during the thermal process because the uniformity of the thermal process is affected by the uniformity of the flow of a reaction gas. In the wafer loading boat, slots are formed at vertical interval for supporting the semiconductor wafer, and at least one or two edges of the semiconductor wafer is then fitted in the slots.

However, in such conventional semiconductor manufacturing system, since the semiconductor wafer is supported on its edges which are placed in the slots, a supporting force is concentrated on the edge area of the semiconductor wafer contacting the slots. In a thermal process at a high temperature, a significant supporting force is concentrated on the edges of the semiconductor wafer, as the gravitational stress due to the weight of the wafer and the thermal stress due to the different thermal expansion are applied to the semiconductor wafer, thereby resulting in final mechanical deformation of the semiconductor wafer such as a form of warp, bow and slip. Such mechanical deformation becomes a more serious problem in a large size semiconductor wafer, a diameter of which is 300 mm (12 inches) and higher, and thus reliability of a process is reduced. In order to prevent such mechanical deformation of the wafer due to high temperature thermal processing and to distribute the gravitational and thermal stresses of the wafer evenly, a wafer loading boat capable of supporting an entire bottom or a portion of surface of the semiconductor wafer is needed. However, a semiconductor manufacturing system having an additional supporting means will be complex and involve still incomplete solution to avoid the mechanical deformation despite higher process cost, and a user will have difficulties in loading and unloading the semiconductor wafer.

SUMMARY OF THE INVENTION

To solve the above-described and related problems, it is an object of the present invention to provide a semiconductor manufacturing system capable of preventing mechanical deformation of a semiconductor wafer having a large diameter during a thermal process, and by which a time of loading and unloading the semiconductor wafer on a plate using a wafer holder can be reduced, thereby reducing costs of manufacturing the semiconductor.

In an aspect, the present invention provides a semiconductor manufacturing system capable of loading a plurality of semiconductor wafers into a vertical reaction tube, and performing a thermal process comprising a first wafer loading boat which is mounted in the reaction tube and includes a plurality of holder supporters that support a wafer holder in a shape of a board, the wafer holder being loaded vertically at a predetermined interval and on which the semiconductor wafer is rested on, a second wafer loading boat which is inside or outside the first wafer loading boat and has a wafer supporter that is located under the semiconductor wafer to support the semiconductor wafer which will rest on the wafer holder, a plate cap which supports the first wafer loading boat and the second loading boat in their lower portions, a door plate which supports the plate cap in the lower portion of the plate cap, and a lifting system which moves at least one of the first wafer loading boat and the second wafer loading boat vertically and separates the semiconductor wafer, which is resting on the wafer holder, from the wafer holder at a predetermined height.

The second wafer loading boat is inwardly adjacent to the first wafer loading boat. The first wafer loading boat comprises the first supporting pillars which are arranged to form a receiving space in a shape of a cylinder inside the first wafer loading boat, a first upper board and a first lower board on which both ends of the first supporting pillars are fixed, and holder supporters which are formed on the first supporting pillars at a predetermined vertical interval to support the wafer holder horizontally. The holder supporters are slots formed by grooving the first supporting pillars. The holder supporters are protrusions protruded at a right angle with respect to the first supporting pillars toward a center of the receiving space to a predetermined length.

The second wafer loading boat comprises the second supporting pillars which are arranged to form an accommodating space in a shape of a cylinder inside the second wafer loading boat, a second upper board and a second lower board at which both ends of supporting pillars are fixed, and wafer supporters which are formed at the second supporting pillars at a predetermined vertical interval to support the semiconductor wafer horizontally. The wafer supporters are protrusions protruded from the second supporting pillars to a predetermined length. The protrusions shall be (or may be) inclined at a predetermined angle.

The wafer supporters further include supporting protrusions which are extended from the ends of the protrusions upwardly at a predetermined height. The ends of the supporting protrusions are inclined inwardly or outwardly toward the center of the receiving space. The wafer supporters are slots formed by grooving the second supporting pillars. The bottom of the slot on which the semiconductor wafer is resting is inclined downwardly at a predetermined angle. The predetermined angle is inclined in a range of $0.1°$ to $45°$ from horizontal level.

The wafer holder comprises a main board which is a circular board, and opening portions are made at the rim of the circular board to allow the second wafer loading boat and the wafer supporters, protrusions, or pillars to vertically move through freely. The opening portion is extended from a circumference of the main board toward the center of the main board at a predetermined length and shape.

The plate cap supports lower portions of the first wafer loading boat and the second wafer loading boat.

The lifting system moves electrically, by a method of fine controlling of a motor, or hydraulically by a fluid pressure. The lifting system is connected to a lower portion of the second wafer loading boat and vertically moves the second wafer loading boat. The lifting system is connected to a lower portion of the first wafer loading boat and vertically moves the first wafer loading boat. The lifting system includes a lifting controller which controls the height at which the first wafer loading boat and the second wafer loading boat move vertically within the pitch of each slot of the holder supporters.

The second wafer loading boat is adjacent to the first wafer loading boat, and the wafer supporters of the second wafer loading boat are protrusions.

The semiconductor manufacturing system according to the present invention includes dual boats having a first wafer loading boat in which the wafer holder can be loaded and a second wafer loading boat which is inside or outside of the first wafer loading boat and in which the semiconductor wafer can be loaded in order to lift the semiconductor wafer up to a predetermined height from the wafer holder. Thus, it is possible to load or unload the semiconductor wafer without unloading the wafer holder from the first wafer loading boat. Therefore, loading or unloading the semiconductor wafer can be performed in a shorter time.

In addition, heat distribution is uniform in the semiconductor wafer due to resting the semiconductor wafer on the wafer holder, which is usually made of heat-conductive material, when loading the semiconductor wafer. Therefore, uniformity in a semiconductor manufacturing process can be improved.

Further, as a wafer bows during a thermal process at high temperatures, the center of wafer can ideally touch the center of the wafer holder with an optimized contact area to minimize the mechanical deformation by adjusting the gap between the first wafer loading boat and the second wafer loading boat before starting the processing. It is possible to adjust the gap dynamically even during the process.

Finally, the shape of the wafer holder can be changed to optimize the contact area of the semiconductor wafer with the wafer holder. Thus, any mechanical or physical defects in the contacting area can be prevented from occurring during the thermal process.

BRIEF DESCRIPTION OF THE DRAWINGS

The above object and advantages of the present invention will become more apparent by describing in detail-preferred embodiments thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
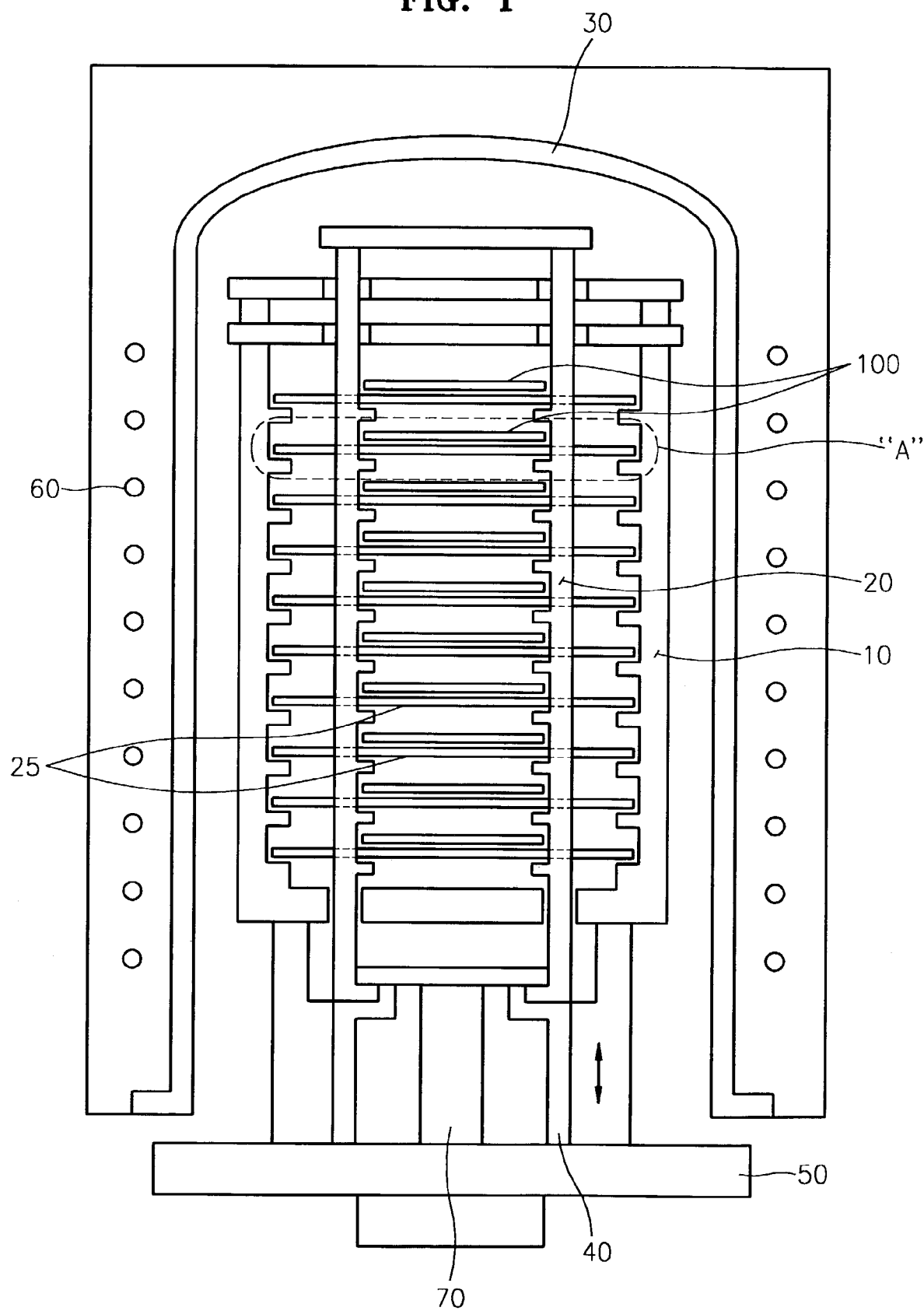
FIG. 1 is a sectional view of a semiconductor manufacturing system according to the present invention.
Figure 2A:
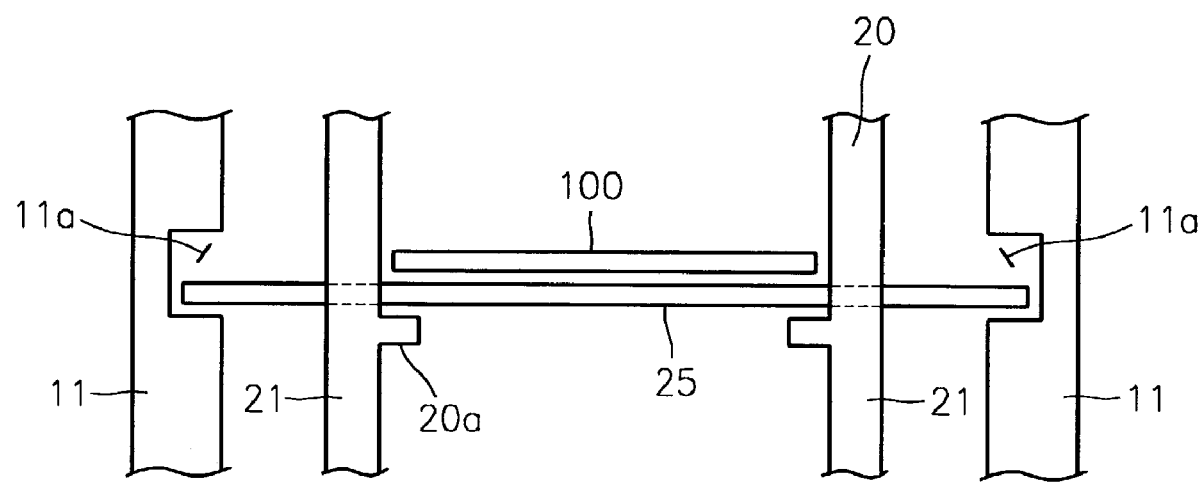
FIG. 2A is an enlarged side-sectional view of portion "A" of FIG. 1.
Figure 2B:
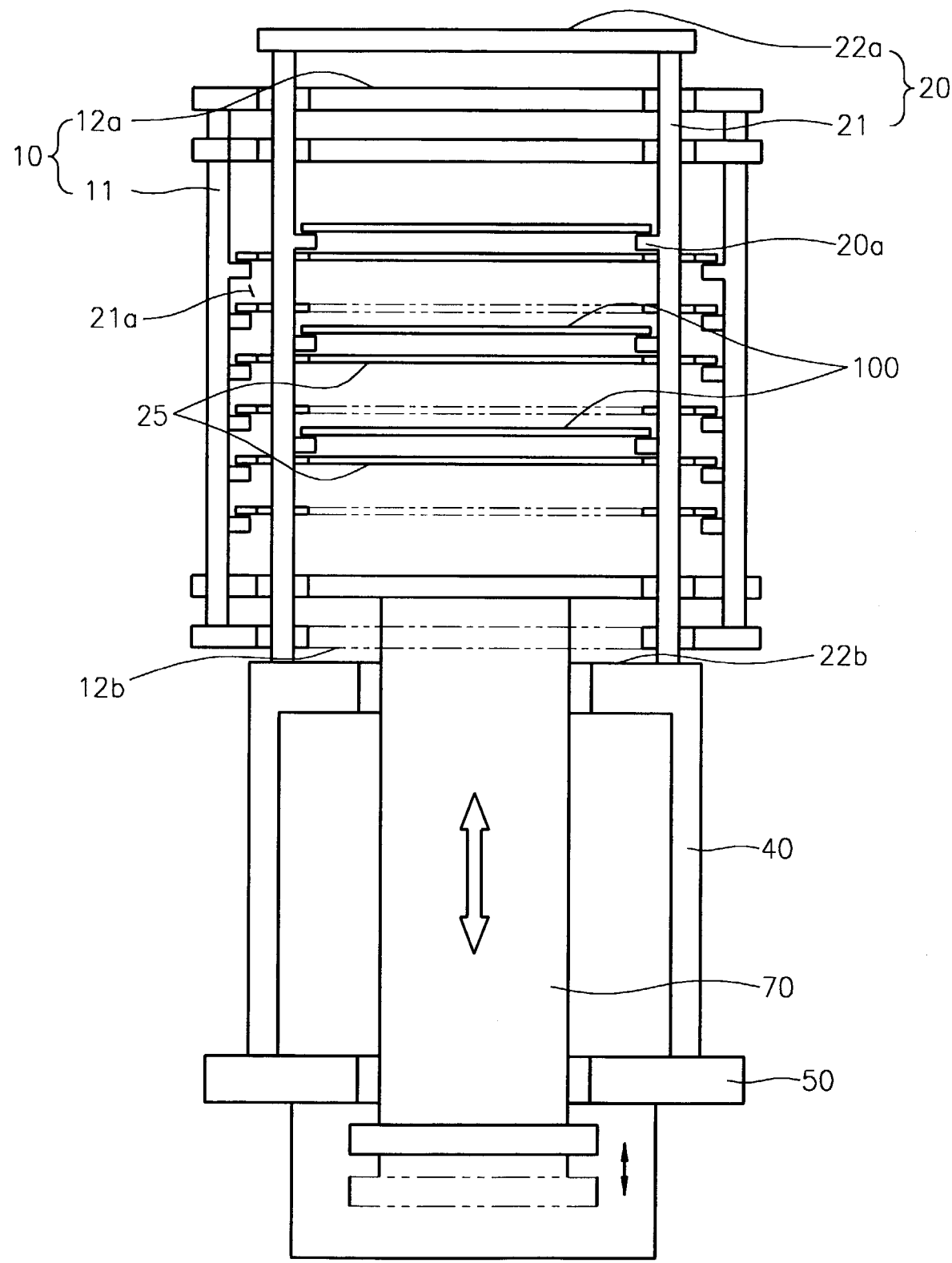
FIG. 2B is a side-sectional view of a dual boat mounted in a semiconductor wafer according to an embodiment of the present invention.

FIG. 1 is a sectional view of a semiconductor manufacturing system according to the present invention. FIG. 2A is an enlarged-sectional view of portion "A" of FIG. 1. FIG. 2B is a side-sectional view of a dual boat mounted in a semiconductor wafer according to an embodiment of the present invention.

Referring to FIG. 1, a semiconductor manufacturing system includes a reaction tube 30 during thermal process. A dual boat including a first wafer loading boat 10 and a second wafer loading boat 20, in which a semiconductor wafer 100 is loaded, are included in the reaction tube 30. The first wafer loading boat 10 includes a plurality of wafer supporters that are horizontally loaded and a plate cap 40 which supports the lower portion of the dual boat. In addition, the semiconductor manufacturing system includes a door plate 50, which supports the plate cap 40 thereunder, inserts the dual boat in the reaction tube 30 and pulls the dual boat out from the reaction tube 30, and a lifting system 50 which moves one plate of the dual boat vertically within a limited height.

Referring to FIGS. 2A and 2B, the dual boat includes the first wafer loading boat 10 and the second wafer loading boat 20 inside the first wafer loading boat 10.

In the first wafer loading boat 10, a number of at least three first supporting pillars 11 are arranged in parallel to each other so as to form a cylindrical space for accommodating the semiconductor wafer 100. In this embodiment, a number of four first supporting pillars 11 are provided. A first upper board 12a and a first lower board 12b for respectively fixing the first supporting pillars 11 at the same level are connected to both ends of the first supporting pillars 11. Each of the first supporting pillars 11 includes a holder supporter 11a in which a slot is formed to a predetermined depth in each of the first supporting pillars 11, and thus a circular board can be put on the holder supporter 11a. The holder supporter 11a is formed in a shape of a slot. A wafer holder 25 in a shape of a circular board is put on the holder supporter 11a. The holder supporter 11a may be a part that is protruded to a predetermined length from the inner center of each of the first supporting pillars 11. The interval between the holder supporters 11a is long enough to allow a wafer loading blade (not shown) to be inserted under the semiconductor wafer 100.

In the second wafer loading boat 20, a number of at least three second supporting pillars 11 are arranged in parallel to each other so as to form a cylindrical space for receiving the semiconductor wafer 100. A second upper board 22a and a second lower board 22b for respectively fixing the second supporting pillars 21 at the same level are connected to both ends of the second supporting pillars 21. In each second supporting pillar 21, a wafer supporter 20a is protruded to a predetermined length from the inner of each of the second supporting pillars 21, so as to lift both edges of the semiconductor wafer 100. Here, the wafer supporter 20a is located in the lower portion of the wafer holder 25, and its position changes into a portion between the holder supporters 11a when the semiconductor wafer is lifted.

The first supporting pillars 11 and the second supporting pillars 21 are arranged not to overlap with one another, and thus a case where the wafer supporter 20a is penetrated with overlapping with an opening portion 25a of a wafer holder 25, and the semiconductor wafer 100 is not supported by the wafer holder 25 can be prevented.

The first wafer loading boat 10 and the second wafer loading boat 20 are supported by one plate cap 40 thereunder. The lifting system 70 extended through the plate cap 40 is connected to the lower portion of the first wafer loading boat 10 or the second wafer loading boat 20, moves one of the first wafer loading boat 10 or the second wafer loading boat 20, and thus lifts the semiconductor wafer 100 up to a predetermined height from the wafer holder 25.

The first wafer loading boat 10 and the second wafer loading boat 20 are formed of quartz or silicon carbide SiC, which have high durability at a high temperature. Likewise, the wafer holder 25 is formed of quartz or silicon carbide SiC. However, it is desirable that the wafer holder 25 is formed by using silicon carbide SiC considering thermal conductivity or thermal absorption. In particular, in a thermal process at very high temperature, it is desirable that the first and the second wafer loading boats and the wafer holder 25 are formed by using silicon carbide SiC.

Figure 3:
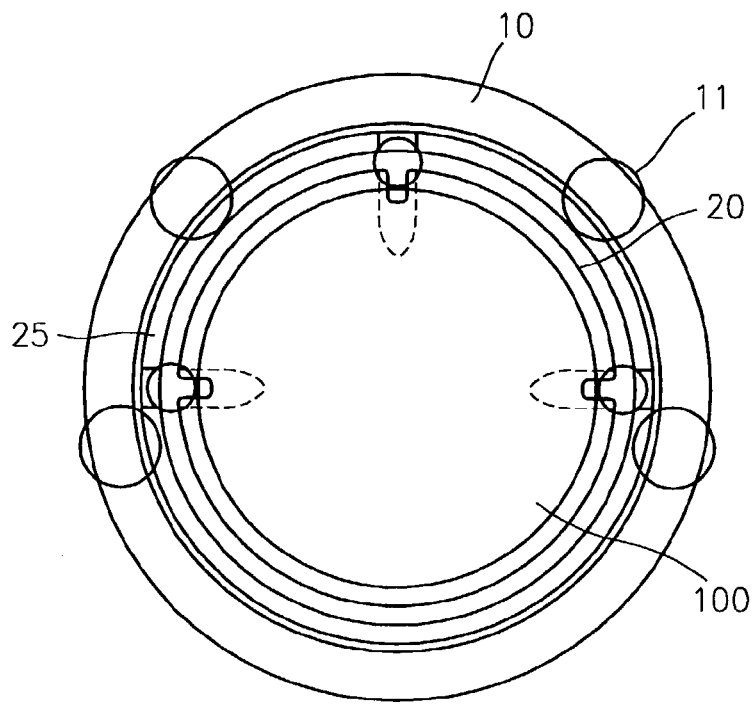
FIG. 3 is a top view of a dual boat mounted in a semiconductor wafer according to an embodiment of the present invention.
Figure 4:
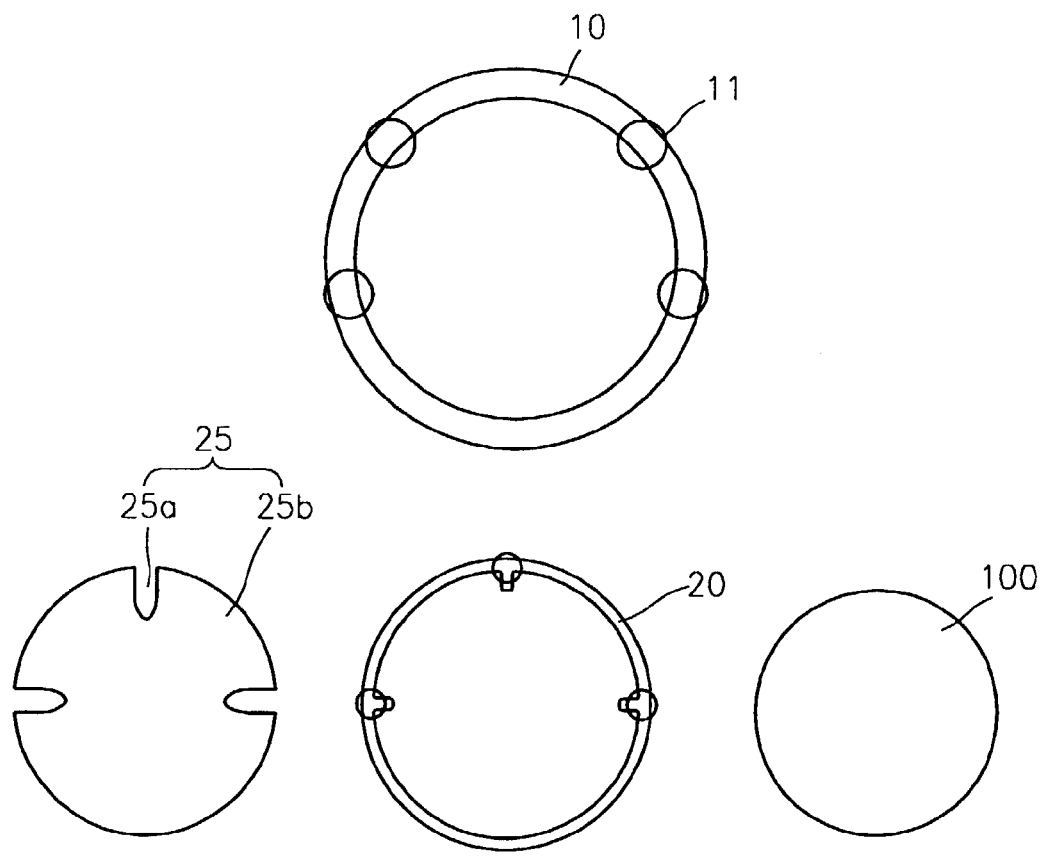
FIG. 4 is a top exploded view of the dual boat mounted in a semiconductor wafer according to an embodiment of the present invention.

FIG. 3 is a top view of an embodiment of a dual boat mounted in a semiconductor wafer, according to the present invention. FIG. 4 is a top exploded view of the dual boat mounted in a semiconductor wafer, according to an embodiment of the present invention.

Referring to FIGS. 3 and 4, the first wafer loading boat 10 is mounted as an outmost circle, and the wafer holder 25 is put on the holder supporter 11a which is included in the first wafer loading boat 10.

The wafer holder 25 includes a main board 25b in a shape of a circular board and an opening portion 25a which is extended from circumference of the main board 25b to the center thereof. The opening portion 25a is formed such that the second supporting pillars 21 of the second wafer loading boat 20 vertically lifts a little space through the opening portion 25a. The width of the opening portion 25a is greater than the size of the wafer supporter 20a.

The second wafer loading boat 20 is formed inside of the first wafer loading boat 10. The semiconductor wafer 100 is formed inside of the second wafer loading boat 20. A part of the circumference of the semiconductor wafer 100 is supported by the wafer supporter 20a of the second wafer loading boat 20. Thus, the wafer holder 25 is supported only by the holder supporter 11a of the first wafer loading boat 10, and the semiconductor wafer 100 is supported by both the holder supporter 11a of the first wafer loading boat 10 and the second wafer loading boat 20. The semiconductor wafer 100 can be lifted from the wafer holder 25 to a certain height by vertically moving either the first wafer loading boat 10 or the second wafer loading boat 20. Here, it is preferable that the semiconductor wafer 100 is lifted up to the middle of the interval between the holder supporters 11a. Thus, the semiconductor wafer 100 has spaces under and over it and can be loaded and unloaded without contacting adjacent semiconductor wafers.

Figure 5:
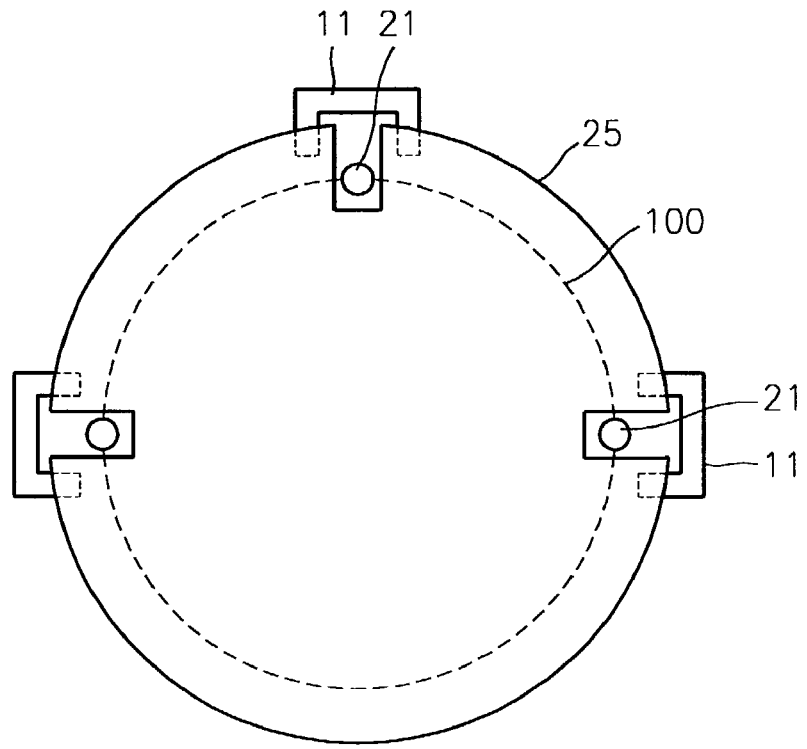
FIG. 5 is a top view of a dual boat mounted in a semiconductor manufacturing system according to an embodiment of the present invention.

FIG. 5 is a top view of another embodiment of the dual boat mounted in a semiconductor manufacturing system, according to the present invention.

Referring to FIG. 5, the first supporting pillar 11 has a groove in its center, which faces the center of the accommodating space. The second supporting pillar 21 is arranged in the similar position on the circumference as the first supporting pillar 11. In the second supporting pillar 21, a slot as in the wafer supporter 20a is formed at a predetermined interval. The holder supporter 11a is formed such that the wafer holder 25 is supported by the lower end of the first supporting pillar 11. Since it is not necessary to arrange the first supporting pillar 11 and the second supporting pillar 21 to cross each other, the structure and manufacture of such dual boat are simple.

Figure 6:
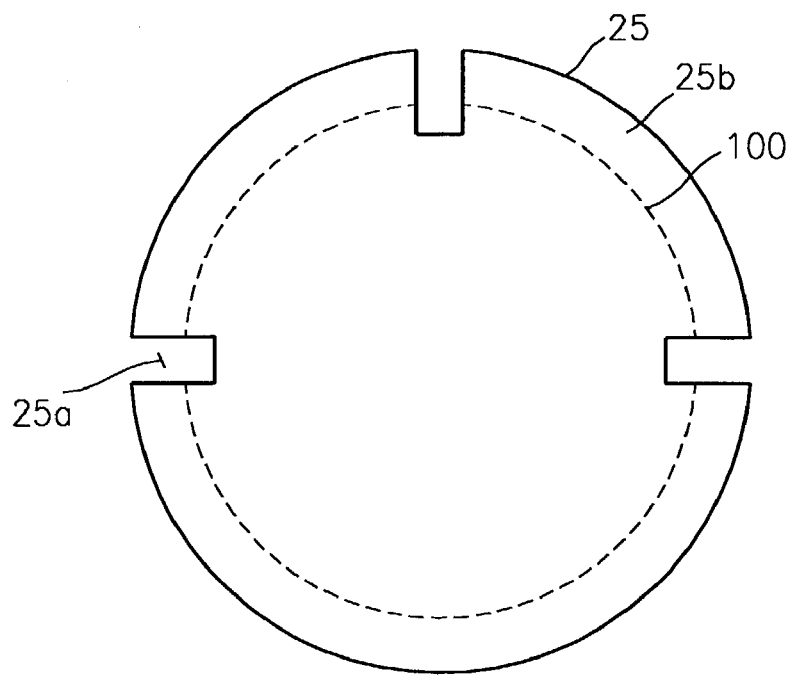
FIG. 6 is a plan view of a wafer holder used in the embodiment of FIG. 5.

FIG. 6 is a plan view of a wafer holder used in the embodiment of FIG. 5. Referring to FIG. 6, the opening portion 25a is formed in a shape of a square in the area of the main board 25b around which the second supporting pillar 21 is located so as to prepare for the case where the first supporting pillar 11 has a section in a shape of a square. It is desirable that the shape of the opening portion 25a is the same as the shape of the section of the second supporting pillar 21.

Figure 7:
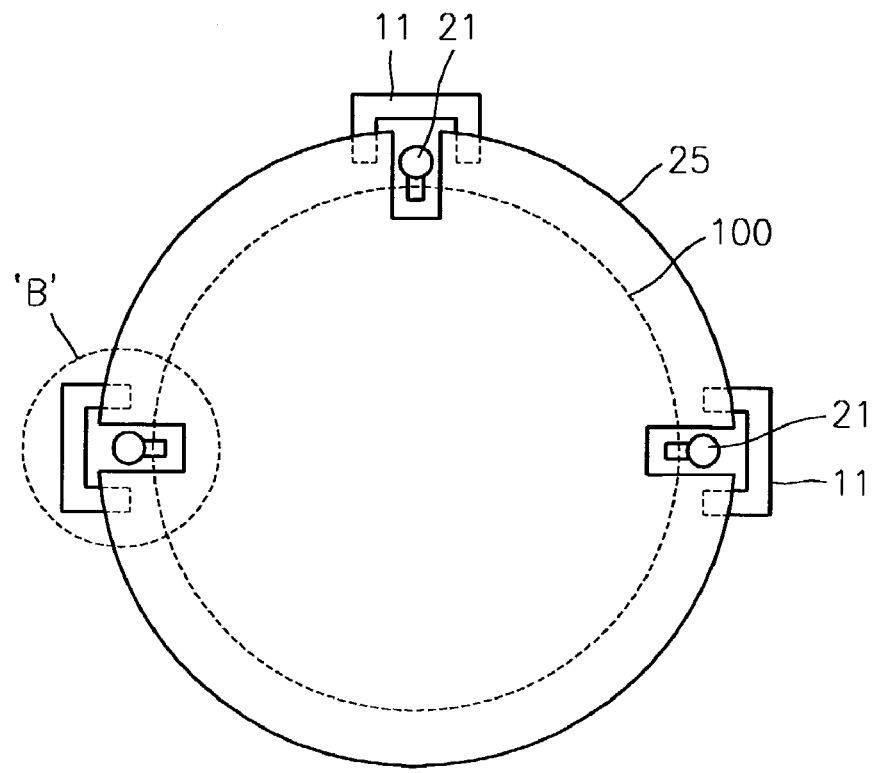
FIG. 7 is an enlarged plan view of a dual boat obtained from the embodiment of FIG. 5.
Figure 8:
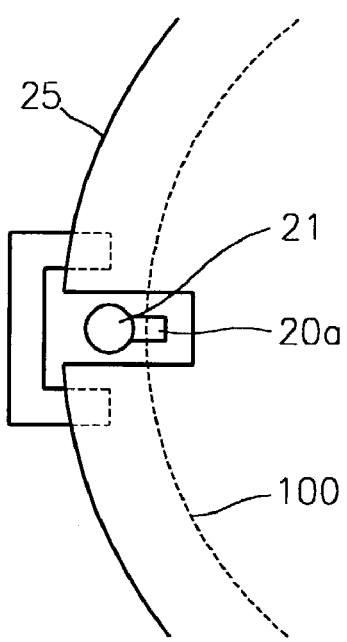
FIG. 8 is an enlarged plan view of portion "B" of FIG. 7.

FIG. 7 is a plan view of a dual boat obtained from the embodiment of FIG. 5. FIG. 8 is a plan view of portion "B" of FIG. 7.

Referring to FIGS. 7 and 8, the first supporting pillar 11 of the first wafer loading boat 10 is similar with that of FIG. 5. However, the wafer supporter 20a of the second supporting pillar 21 is in a shape of a protrusion type rather a slot.

FIGS. 9A through 9D are sectional views of an embodiment of a wafer supporter of a second wafer loading boat of a semiconductor manufacturing system according to the present invention.

Figure 9A:
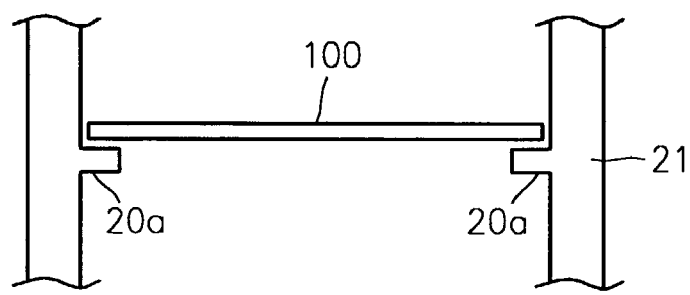
FIGS. 9A through 9D are sectional views of a wafer supporter of a second wafer loading boat of a semiconductor manufacturing system, according to an embodiment of the present invention.

Referring to FIG. 9A, the wafer supporter 20a is protruded horizontally at right angle to the second supporting pillar 21. The surface of the wafer supporter 20a, on which the semiconductor wafer 100 is put, is flat so that the semiconductor wafer 100 can be stably supported. In particular, the top surface of the wafer supporter 20a is almost square, and thus the semiconductor wafer 100 can be stably put on the surface of the wafer supporter 20a.

Figure 9B:
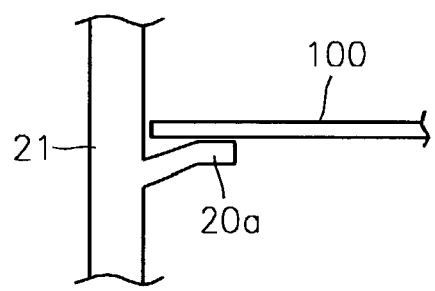
Figure 9C:
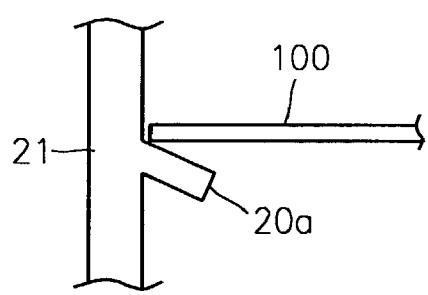
Figure 9D:
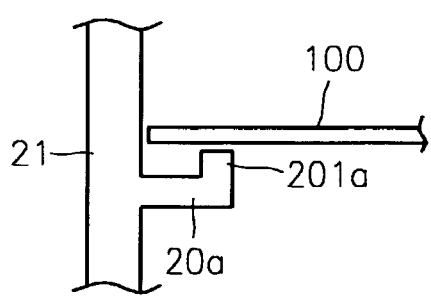

FIGS. 9B through 9D shows changes in the wafer supporter 20a of FIG. 9A, wherein the wafer supporter 20a has certain angles upwardly or downwardly from its horizontal position. If the wafer supporter 20a is inclined upwardly as shown in FIG. 9B, its end on which the semiconductor wafer 100 is put is rounded or flattened so as to prevent scratches occurring in a contact area of the semiconductor wafer 100 with the wafer supporter 20a.

Such wafer supporter 20a can prevent defects such as a slip or a scratch occurring when the semiconductor wafer 100 contacts the wafer supporter 20a by minimizing the contact area of the semiconductor wafer 100 with the wafer supporter 20a.

Referring to FIG. 9D, the wafer supporter 20a further includes a protrusion supporter 201 which is upwardly protruded from an end of the wafer supporter 20a. In such wafer supporter 20a, the semiconductor wafer 100 is supported by an end of the protrusion supporter 201a rather the surface of the wafer supporter 20a. The end of the protrusion supporter 201a can be formed horizontally or be inclined upwardly or downwardly. Thus, the protrusion supporter 201a having the inclined end can be used during thermal process at a high temperature, and the protrusion supporter 201a having the flattened end can be used to the process at a middle range of temperature.

Figure 10A:
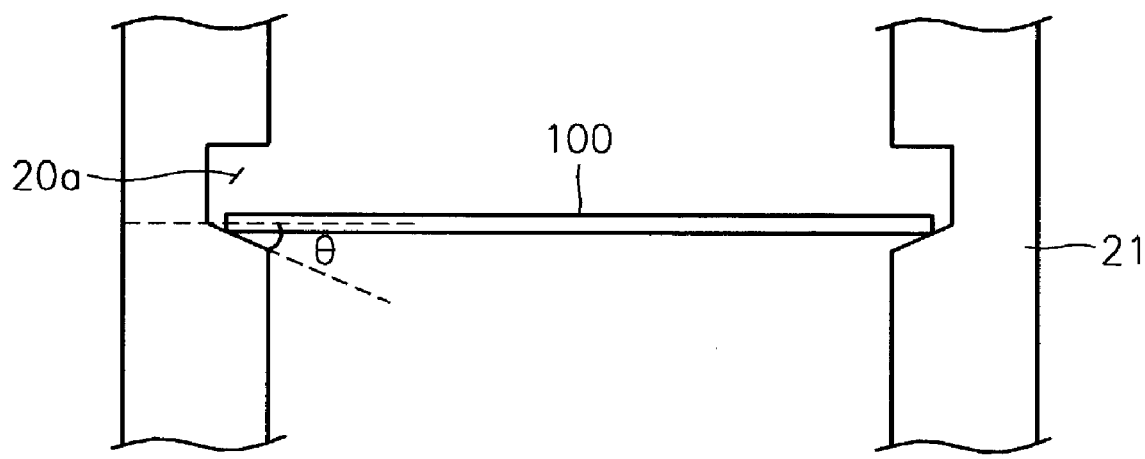
FIG. 10A is a sectional view a wafer supporter of a second wafer loading boat of a semiconductor manufacturing system, according to an embodiment of the present invention.
Figure 10B:
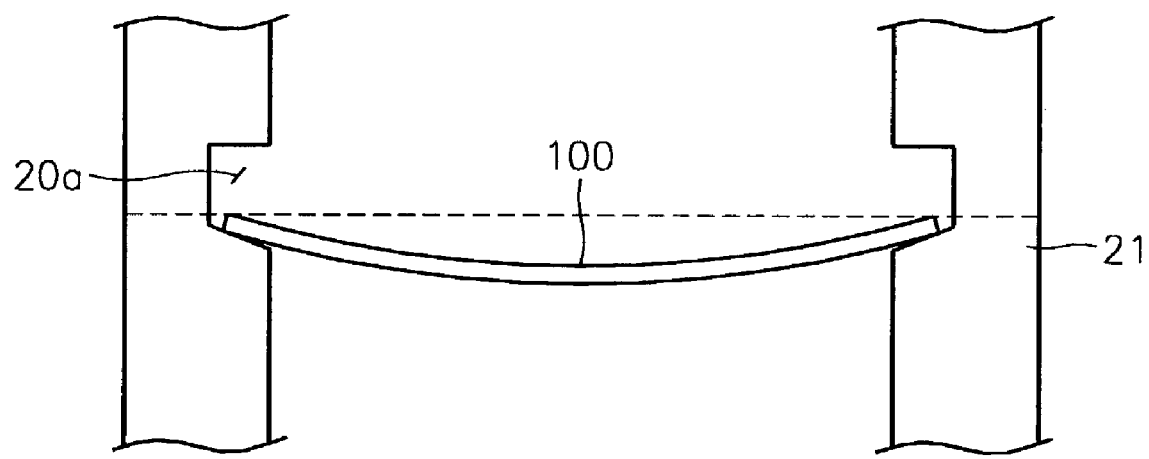
FIG. 10B is a sectional view showing a warped semiconductor wafer on a wafer supporter of a second wafer loading boat of FIG. 10A after a thermal process at a high temperature.

FIG. 10A is a sectional view of another embodiment of a wafer supporter of a second wafer loading boat of a semiconductor manufacturing system, according to the present invention. FIG. 10B is a sectional view showing a warped semiconductor wafer on a wafer supporter of a second wafer loading boat of FIG. 10A after a thermal process at a high temperature.

Referring to FIG. 10A, the wafer supporter 20a in a shape of a slot is formed by grooving the second supporting pillar 21. Here, the lower portion of the wafer supporter 20a is inclined downwardly with predetermined angle in a range of 0.10° to 45° so as to minimize the contact area of the semiconductor wafer 100 with the wafer supporter 20a, and thus only a small portion of the end of the semiconductor wafer 100 are rested on the wafer supporter 20a.

Referring to FIG. 10B, in the thermal process at a high temperature, the semiconductor wafer 100 is heated, and thus the middle portion of the semiconductor wafer 100 is warped downwardly by gravity. Such mechanical deformation causes the edges of the semiconductor wafer 100 to be warped as well, and thus the contact area of the semiconductor wafer 100 with the wafer supporter 20a increases. Then, a supporting point moves toward the middle of the semiconductor wafer 100, and a supporting force of the semiconductor wafer 100 which is warped acts on a surface contact rather than a contact point, thereby reducing stress in the semiconductor wafer 100.

Figure 11:
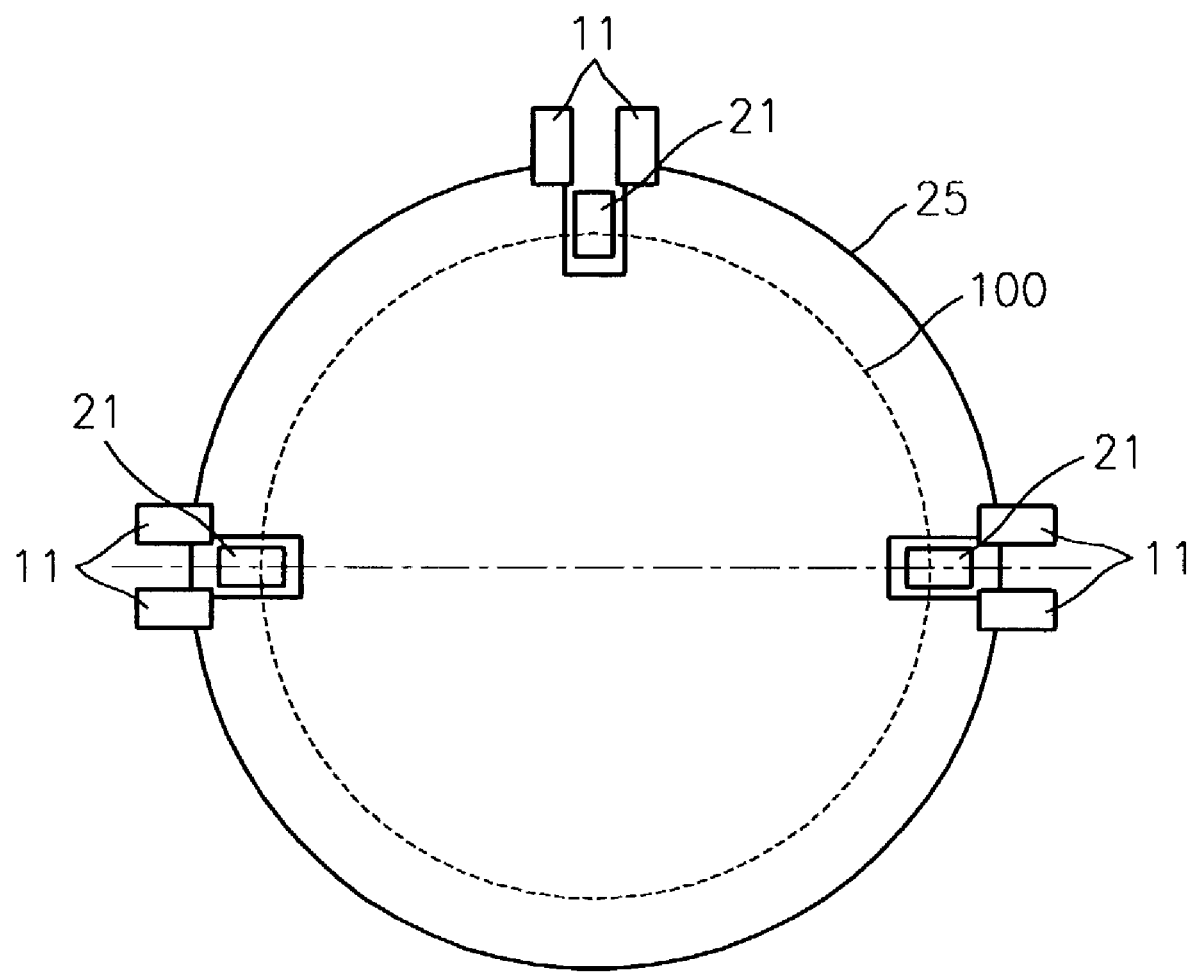
FIG. 11 is a sectional plan view of a dual boat mounted in a semiconductor manufacturing system, according to an embodiment of the present invention.

FIG. 11 is a sectional plan view of another embodiment of the dual boat mounted in a semiconductor manufacturing system, according to the present invention.

Referring to FIG. 11, each of the first supporting pillar 11 has two pillars which are arranged in parallel with each other and are separated from each other by a predetermined interval. The width of the predetermined interval is larger than the width of the section of the second supporting pillar 21. Thus, a case where opening portion 25a of the wafer holder 25 and the hold supporter 11a of the first supporting pillar 11 overlap with each other and thus the wafer holder 25 is not supported can be prevented. In addition, such first supporting pillar 11 is advantageous in that the first supporting pillar 11 and the second supporting pillar 21 can be arranged symmetrically. Here, the first and the second supporting pillars 11 and 21 can be formed in shapes of a cylinder, a square or other shapes having a polygonal section.

Figure 12A:
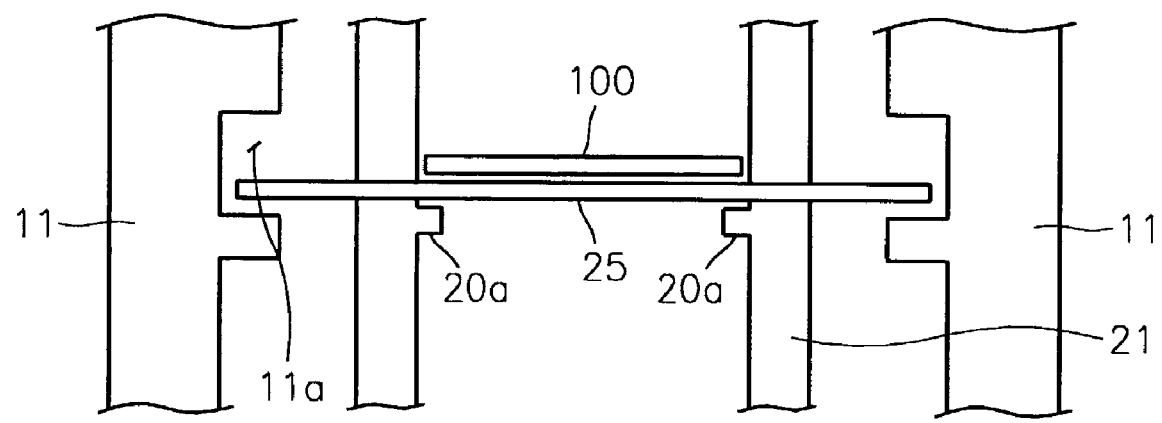
FIG. 12A is a side-sectional view of a dual boat, according to an embodiment of the present invention, mounted in a reaction tube.
Figure 12B:
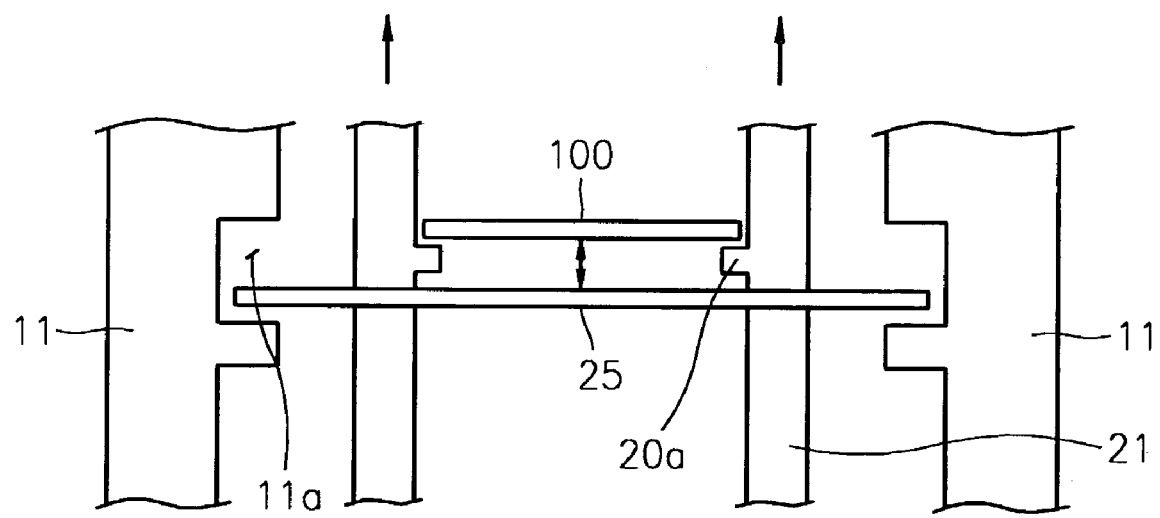
FIG. 12B is a side-sectional view of a dual boat when loading and unloading a semiconductor wafer.

FIG. 12A is a side-sectional view of the dual boat according to an embodiment of the present invention being mounted in a reaction tube. FIG. 12B is a side-sectional view of the dual boat when loading and unloading a semiconductor wafer, according to an embodiment of the present invention.

Referring to FIG. 12A, when the thermal process is performed while the semiconductor wafer 100 is loaded on to the dual boat, the wafer supporter 20a of the second wafer loading boat 20 is arranged in parallel with the holder supporter 11a of the first wafer loading boat 10. Thus, the semiconductor wafer 100 is supported by the wafer holder 25 while contacting the wafer holder 25. Then, a reaction gas is provided into the reaction tube 30, and the semiconductor wafer 100 is thermally processed.

Referring to FIG. 12B, when the semiconductor wafer 100 is loaded or unloaded before or after the thermal process is performed, the door plate 50 in FIG. 1 is lowered, and the dual boat is pulled out from the reaction tube 30 to provide a position in which the semiconductor wafer 100 can be loaded or unloaded. Then, the lifting system 70 lifts either the first wafer loading boat 10 or the second wafer loading boat 20 up to a predetermined height to lift the semiconductor wafer 100 from the wafer holder 25 to a predetermined height. Thus, the semiconductor wafer 100 is located between the holder supporters 11a and has spaces under and above it.

Figure 12C:
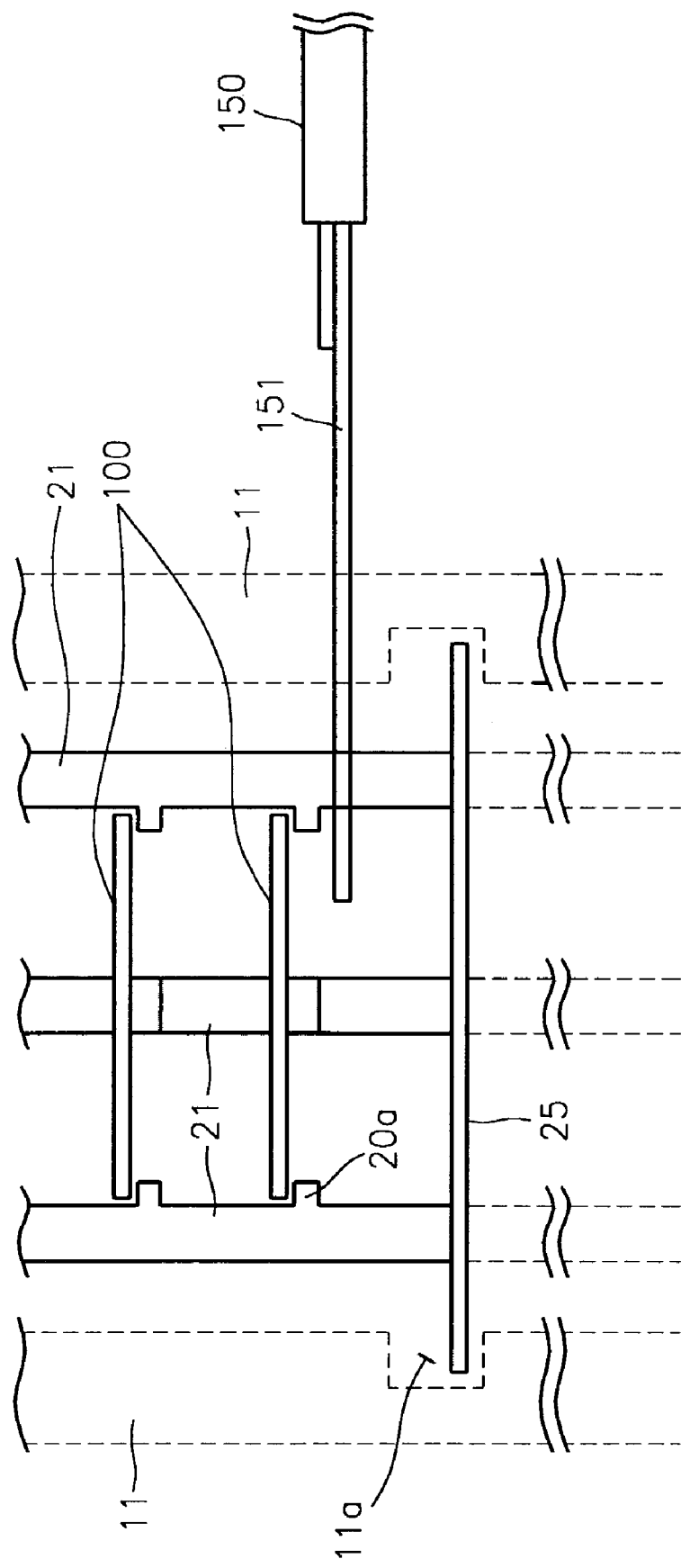
FIG. 12C is a lateral-sectional view showing the handling of a semiconductor wafer in a dual boat, according to an embodiment of the present invention.

FIG. 12C shows a phase of unloading the semiconductor wafer 100 from the dual boat using a wafer handler 150.

Referring to FIG. 12C, if the semiconductor wafer 100 has empty spaces under and above as shown in FIG. 12B, a blade 151 of the wafer handler 150 is inserted under the semiconductor wafer 100, and the semiconductor wafer 100 is pulled out from the second wafer loading boat 20 and is loaded in a cassette placed in out space (not shown). The semiconductor wafer 100 may be pulled out from the exterior cassette and be loaded in the wafer supporter 20a of the second wafer loading boat 20.

The lifting system 70 is mounted in the plate cap 40 and the door plate 50 under the dual boat. The lifting system 70 is in a shape of a cylinder, an end of which is connected to the second lower board 22b while other end is supported by the door plate 50. Thus, the semiconductor wafer 100 is lifted by lifting the second wafer loading boat 20 a little. Here, in order to prevent the semiconductor wafer 100 from bumping into the wafer holder 25, it is preferable that the width of moving the lifting system 70 is smaller than the width of the spaces between the holder supporters 11a. The lifting system 70 can be moved electrically by a method of fine controlling a motor, or fluid hydraulically by pressurized or vacuum pressure which can smoothly provide a huge lifting force.

The lifting system 70 may be connected to the first lower board 12b of the first wafer loading boat 10. Thus, the semiconductor wafer 100 can be lifted from the wafer holder 25 by moving vertically the first wafer loading boat 10. In this case, the first wafer loading boat 10 has to move downwardly.

As described above, the semiconductor manufacturing system according to the present invention includes the dual boat formed by overlapping the first wafer loading boat 10 and the second wafer loading boat 20 and supports the semiconductor wafer 100 by using the wafer holder 25. Therefore, a semiconductor wafer having a diameter greater than 12 inches, i.e., 300 mm, can be thermally processed without being warped at a high temperature. In addition, the wafer holder 25 under the semiconductor wafer 100 serves as a heat sink in a process of forming a film by thermal oxidation or by chemical vapor deposition (CVD) and an annealing process, and heat is uniformly distributed in the semiconductor wafer 100. Therefore, uniformity in the semiconductor manufacturing process can be improved.

In addition, it is possible to directly load or unload the semiconductor wafer 100 in or out of the dual boat without unloading the wafer holder 25 from the dual boat, by configuring the first wafer loading boat 10 and the second wafer loading boat 20 such that they can be lifted at a predetermined height. Thus, the semiconductor wafer 100 can be loaded or unloaded while using the wafer holder 25 in the dual boat.

Considering safety of the operation, it is preferable that a lighter one of the first wafer loading boat 10 and the second wafer loading boat 20 is lifted when loading or unloading the semiconductor wafer 100.

The lifting system 70 can be provided under the plate cap 40 or in the door plate 50 so as to lift the first wafer loading boat 10 or the second wafer loading boat 20. Without the additional lifting system 70, the second wafer loading boat 20 can be located in a higher portion than the first wafer loading boat 10 by lowering the door plate 50 out of the reaction tube 30 and resting the door plate 50 on the floor. Then, since the dual boat is affected by gravity, the second wafer loading boat 20 is lifted up to a predetermined height with respect to the first wafer loading boat 10. Thus, the semiconductor wafer 100 is separated from the wafer holder 25. Here, in order to accurately control the lifting height, the lifting system 70 includes (not shown) in which a motor for controlling a height such as a step motor is mounted. Thus, the lifting controller (not shown) can accurately control the height at which the semiconductor wafer 100 is lifted from the wafer holder 25.

The controller (not shown) is also connected to a central control unit (not shown) of the semiconductor manufacturing system and can be controlled in creating a recipe file for a unit process. Then, it is possible to program the semiconductor manufacturing system to control the height of the semiconductor wafer 100 from the wafer holder 25 during the thermal process.

In the present invention, the first wafer loading boat 10 is placed outside the second wafer loading boat 20. However, the second wafer loading boat 20 can be placed outside the first wafer loading boat 10. In this case, the above embodiments can be applied. However, it is preferable that the wafer supporter 20a is in a shape of a protrusion type, which is extended from the second supporting pillar 21 to under the semiconductor wafer 100, rather than a shape of a slot type, which is formed by grooving the second supporting pillar 21.

In the semiconductor manufacturing system according to the present invention, the semiconductor wafer is supported by the wafer holder which is under the semiconductor wafer, and thus the semiconductor wafer having a large diameter can be supported without mechanical deformation of the semiconductor wafer.

In addition, since the wafer holder serves as a heat sink during a thermal process, temperature can be uniformly controlled, and thus reliability of the process can be improved.

The semiconductor manufacturing system according to the present invention includes the dual boat having the first wafer loading boat which supports the wafer holder and the second wafer loading boat which lifts the semiconductor wafer from the wafer holder up to a predetermined height. Then, the semiconductor wafer can be loaded or unloaded without unloading the wafer holder. Thus, a time necessary for loading or unloading the semiconductor wafer can be reduced.

In addition, the shape of the wafer supporter can be changed to minimize the contact area of the semiconductor wafer with the wafer supporter. Thus, any mechanical or physical defect in the contact area can be prevented from occurring during the thermal process.

While this invention has been particularly described with reference to preferred embodiments thereof, it will be understood by those skilled in the art that various changes in form and details may be made therein without departing from the spirit and scope of the invention as defined by the appended claims and equivalents thereof.

What is claimed is:

1. A semiconductor manufacturing system capable of loading a plurality of semiconductor wafers into a vertical reaction tube, and performing a thermal process, the system comprising:
    a first wafer loading boat which is mounted in the reaction tube and includes a plurality of holder supporters that support a wafer holder in a shape of a board, the wafer holder being loaded vertically at a predetermined interval and on which the semiconductor wafer is rested on;
    a second wafer loading boat which is inside the first wafer loading boat and has wafer supporters that are located under the semiconductor wafer to support the semiconductor wafers;
    a plate cap which supports the first wafer loading boat and the second wafer loading boat in their lower portions;
    a door plate which supports the plate cap in the lower portion of the plate cap;
    a lifting system which moves at least one of the first wafer loading boat and the second wafer loading boat vertically and separates the semiconductor wafer, which is loaded on the wafer holder, from the wafer holder at a predetermined height during wafer load and unload cycles;
    wherein the wafer holder comprises:
    a main board which is a circular board and opening portions which are made at the rim of the circular board to allow the second wafer loading boat and the wafer supporters to vertically move there through freely.

2. The system of claim 1, wherein the second wafer loading boat is inwardly adjacent to the first wafer loading boat.

3. The system of claim 1, wherein the second wafer loading boat comprises:
    at least one second supporting pillars which are arranged to form an accommodating space in a shape of a cylinder inside the second wafer loading boat;
    a second upper board and a second lower board at which both ends of the second supporting pillars are fixed; and
    wafer supporters which are formed at the second supporting pillars at a predetermined vertical interval to support the semiconductor wafer horizontally.

4. The system of claim 3, wherein the wafer supporters are protrusions protruded from the second supporting pillars to a predetermined length and shape.

5. The system of claim 4, wherein the protrusions are inclined at a predetermined angle.

6. The system of claim 4, wherein the wafer supporters further includes supporting protrusions which are extended from the ends of the protrusions upwardly at a predetermined height.

7. The system of claim 6, wherein the ends of the supporting protrusions are inclined inwardly or outwardly toward the center of the receiving space.

8. The system of claim 4, wherein the wafer supporter is a slot formed by grooving the second supporting pillars.

9. The system of claim 8, wherein the bottom of the slot on which the semiconductor wafer is rested is inclined downwardly at a predetermined angle.

10. The system of claim 9, wherein the predetermined angle is in a range of 0.10° to 45° downward from horizontal level.

11. The system of claim 1, wherein the opening portion is extended from a circumference of the main board toward the center of the main board at a predetermined length and shape.

12. The system of claim 1, wherein the surface of the wafer holder has grooved or protruded shape patterns, which are additionally processed from a simple circular board.

13. The system of claim 1, wherein the plate cap supports lower portions of the first wafer loading boat and the second wafer loading boat.

14. The system of claim 1, wherein the lifting system moves electrically, by a method of fine controlling of a motor, or hydraulically by a fluid pressure.

15. The system of claim 1, wherein the lifting system is connected to a lower portion of the second wafer loading boat and vertically moves the second wafer loading boat.

16. The system of claim 1, wherein the lifting system is connected to a lower portion of the first wafer loading boat and vertically moves the first wafer loading boat.

17. The system of claim 1, wherein the lifting system includes a lifting controller which controls the height at which the first wafer loading boat and the second wafer loading boat vertically move within the distance of pitch of the holder supporters.

18. The system of claim 1, wherein the second wafer loading boat is adjacent to the first wafer loading boat, and the wafer supporters of the second wafer loading boat are protrusions.

19. The system of claim 1, wherein the first wafer loading boat comprises:
   at least one first supporting pillars which are arranged to form a receiving space in a shape of a cylinder inside the first wafer loading boat;
   a first upper board and a first lower board on which both ends of the first supporting pillars are fixed; and
   holder supporters which are formed on the first supporting pillars at a predetermined vertical interval to support the wafer holder horizontally.

20. The system of claim 19, wherein the holder supporters are slots formed by grooving the first supporting pillars.

21. The system of claim 19, wherein the number of the first supporting pillars are at least two which are separated from each other at a predetermined distance.

22. The system of claim 19, wherein the holder supporters are protrusions protruded at a right angle with respect to the first supporting pillars toward a center of the receiving space to a predetermined length and shape.

* * * * *